(12) United States Patent
Ueda

(10) Patent No.: US 8,405,200 B2
(45) Date of Patent: Mar. 26, 2013

(54) ELECTRONIC-COMPONENT-HOUSING PACKAGE AND ELECTRONIC DEVICE

(75) Inventor: Yoshiaki Ueda, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 573 days.

(21) Appl. No.: 12/602,461

(22) PCT Filed: Mar. 27, 2008

(86) PCT No.: PCT/JP2008/055929
§ 371 (c)(1),
(2), (4) Date: Apr. 15, 2010

(87) PCT Pub. No.: WO2008/146531
PCT Pub. Date: Dec. 4, 2008

(65) Prior Publication Data
US 2010/0200932 A1 Aug. 12, 2010

(30) Foreign Application Priority Data

May 29, 2007 (JP) .................................. 2007-142125
Nov. 28, 2007 (JP) .................................. 2007-307969

(51) Int. Cl.
*H01L 23/48* (2006.01)

(52) U.S. Cl. ........ 257/693; 257/692; 257/723; 257/730; 257/E21.499; 438/123

(58) Field of Classification Search ................. 257/692, 257/693, 723, 730, E21.499; 438/123
See application file for complete search history.

(56) References Cited

U.S. PATENT DOCUMENTS

| | | | | |
|---|---|---|---|---|
| 4,947,234 A * | 8/1990 | Einzinger et al. | ............. | 257/500 |
| 5,814,884 A * | 9/1998 | Davis et al. | ................... | 257/723 |
| 6,348,727 B1 * | 2/2002 | Westmarland et al. | ....... | 257/675 |
| 6,529,062 B2 * | 3/2003 | Majumdar et al. | ............ | 327/434 |
| 7,208,818 B2 * | 4/2007 | Luo et al. | ..................... | 257/666 |

FOREIGN PATENT DOCUMENTS

| | | |
|---|---|---|
| JP | 55-32004 | 3/1980 |
| JP | 57-115253 | 7/1982 |
| JP | 01-028943 | 1/1989 |
| JP | 64028943 A | 1/1989 |
| JP | 03-079065 | 4/1991 |
| JP | 03-120849 | 5/1991 |
| JP | 07-297336 | 11/1995 |
| JP | 08167677 A | 6/1996 |
| JP | 08-222653 | 8/1996 |
| JP | 2000-195894 | 7/2000 |
| JP | 2003068967 A | 3/2003 |
| JP | 2003-115554 | 4/2003 |
| JP | 2005-216641 | 8/2005 |

* cited by examiner

*Primary Examiner* — Jarrett Stark
*Assistant Examiner* — Nicholas Tobergte
(74) *Attorney, Agent, or Firm* — DLA Piper LLP (US)

(57) ABSTRACT

An electronic-component-housing package comprises a container including a rectangular mount on which an electronic component is to be mounted and a sidewall surrounding the mount. The electronic-component-housing package comprises a lead terminal extending from an inside of a space enclosed by the sidewall to an outside of the space. A tip part of the lead terminal is extending along one side of the mount.

12 Claims, 5 Drawing Sheets

ELECTRONIC-COMPONENT-HOUSING PACKAGE AND ELECTRONIC DEVICE

CROSS-REFERENCE TO THE RELATED APPLICATIONS

This application is a national stage of international application No. PCT/JP2008/055929 filed on Mar. 27, 2008, and claims the benefit of priority under 35 USC 119 to Japanese Patent Application No. 2007-142125 filed May 29, 2007 and Japanese Patent Application No. 2007-307969 filed Nov. 28, 2007, the entire contents of which are incorporated herein by reference.

TECHNICAL FIELD

The present invention relates to an electronic-component-housing package and an electronic device.

BACKGROUND ART

A perspective view of a connection terminal for a conventional electronic-component-housing package (hereinafter also simply referred to as package) is shown in FIG. 5A. A perspective view of a package with the connection terminal is shown in FIG. 5B. In these drawings, 101 denotes a flat-plate member comprising ceramic, 102 denotes an upright-wall member comprising ceramic, 103 denotes a metallized layer forming a line conductor, and 104 denotes a lead terminal comprising copper wire and extending through the upright-wall member 102.

As shown in FIG. 5B, the connection terminals are attached to an attachment 106a provided on a sidewall 106 of the package. Electrodes of a semiconductor element 107 and portions of the lead terminals 104 placed inside the package are electrically connected to each other with bonding wires 105 (see Japanese Patent Application Publication No. 2003-115554, for example).

In the above conventional package, however, the bonding wires 105 connecting the lead terminals 104 and the electrodes of the semiconductor element 107 are long. This leads to a problem that some resistance loss often occurs because of the resistances of the bonding wires 105, even if the lead terminals 104 are made to extend through the package from the outside to the inside thereof.

Hence, it has been desired that an electronic-component-housing package and an electronic device be provided in which the resistance loss occurring at connections with connection lines, such as bonding wires, is reduced.

SUMMARY OF THE INVENTION

An electronic-component-housing package according to an embodiment of the present invention includes a container comprising a rectangular mount and a sidewall surrounding the mount, the mount having a top surface on which an electronic component is to be mounted; and a lead terminal extending from an inside of a space enclosed by the top surface and the sidewall to an outside of the space, a tip part of the lead terminal extending and being attached along one side of the mount.

An electronic device according to another embodiment of the present invention includes the electronic-component-housing package, an electronic component comprising an electrode on a top surface thereof and being mounted on the mount, a plurality of connection lines with which the lead terminal and the electrode are electrically connected to each other, and a lid member attached to a top surface of the sidewall and covering the interior of the container.

The electronic-component-housing package according to the embodiment of the present invention includes the lead terminal extending from an inside of a space enclosed by the top surface and the sidewall to an outside of the space with the tip part of the lead terminal extending and being attached along one side of the mount. Therefore, the tip part of the lead terminal can be positioned near the electronic component. Accordingly, a connection line, such as a bonding wire, connecting the lead terminal and the electrode of the electronic component can be made shorter than in the conventional case. Consequently, the resistance loss caused by the connection line, such as a bonding wire, can be reduced.

The electronic device according to the embodiment of the present invention includes the electronic-component-housing package, the electronic component including the electrode on the top surface thereof and being mounted on the mount, the plurality of connection lines with which the lead terminal and the electrode are electrically connected to each other, and the lid member attached to the top surface of the sidewall and covering the interior of the container. Therefore, the operability of the connection lines, such as bonding wires, connecting the lead terminal and the electrode of the electronic component can be improved.

DESCRIPTION OF THE PREFERRED EMBODIMENT

An electronic-component-housing package and an electronic device according to an embodiment of the present invention will now be described in detail.

Figure 1:
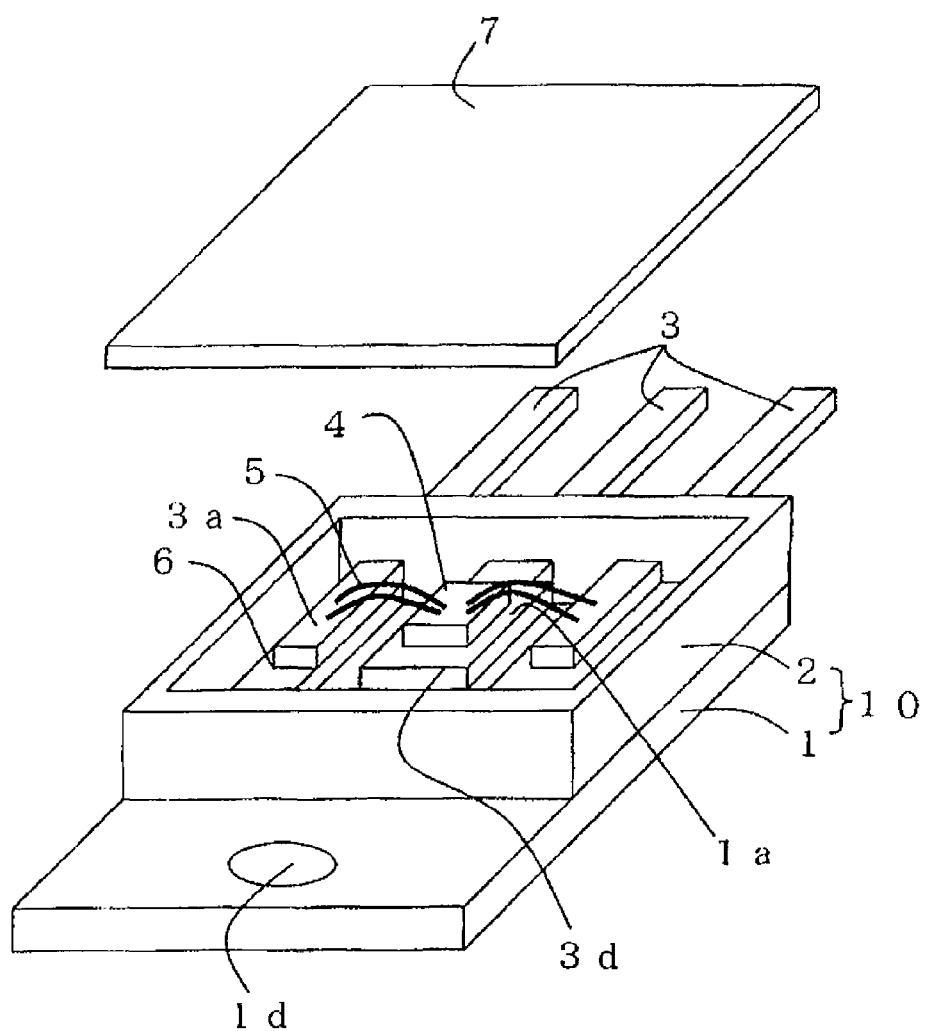
FIG. 1 is a perspective assembly view of an electronic-component-housing package and an electronic device including the same according to an embodiment of the present invention.

As shown in FIG. 1, the electronic device according to the embodiment includes a container 10 having a rectangular mount 1a and a sidewall 2 surrounding the mount 1a, the mount 1a having the top surface on which an electronic component 4 is to be mounted; an electronic component 4 having electrodes on the top surface thereof and mounted on the mount 1a; a plurality of connection lines 5 electrically connecting lead terminals 3 and the electrodes to each other; a lid member 7 attached to the top surface of the sidewall 2 and covering the interior of the container 10; and the lead terminals 3 extending from the inside of a space enclosed by the top surface and the sidewall 2 to the outside of the space with tip parts 3a thereof extending and being attached along one side of the mount 1a.

Here, the tip parts 3a of the lead terminals 3 placed inside the container 10 are each a portion extending along the one side of the mount.

In this case, the tip parts 3a of the lead terminals 3 can be positioned near the electronic component 4. Therefore, the connection lines 5, such as bonding wires, connecting the lead terminals 3 and the electrodes of the electronic component 4 can be made shorter than in the conventional case. Consequently, the resistance loss caused by the connection lines 5, such as bonding wires, can be reduced. Moreover, the operability of the connection lines 5, such as bonding wires, connecting the lead terminals 3 and the electrodes of the electronic component 4 can be improved. Besides, in a configuration in which a plurality of the connection lines 5 are provided, it is easier to, for example, prepare a plurality of the connection lines 5 having the same length. Accordingly, the resistance loss occurring at the connections between the lead terminals 3 and the electronic component 4 can be further reduced.

Individual elements according to the embodiment will now be described in detail.
(Electronic-Component-Housing Package)
(Container)

The container 10 comprises a dielectric material such as alumina ($Al_2O_3$) ceramic; aluminum nitride (AlN) ceramic; mullite ($3Al_2O_3 \cdot 2SiO_2$) ceramic; zirconia ($ZrO_2$) ceramic; silicon nitride ($Si_3N_4$) ceramic; silicon carbide (Sic) ceramic; resin; or glass, or metal such as copper tungsten (Cu—W); copper molybdenum (Cu—Mo); an iron-nickel-cobalt (Fe—Ni—Co) alloy; copper (Cu); or stainless steel (SUS).

The embodiment concerns a case where the container 10 includes a bottom plate 1 and the sidewall 2 bonded together. The container 10 may be provided as an integral body, or may be provided by separately preparing the bottom plate 1 and the sidewall 2 and subsequently bonding the two together.

Preferably, the bottom plate 1 and the sidewall 2 are separately prepared in advance and are subsequently bonded together. In such a configuration, the container 10 can be obtained by bonding the sidewall 2 having a frame-like shape onto the top surface of the bottom plate 1 having a plate-like shape. Accordingly, the container 10 can be manufactured easily and becomes suitable for mass production.

The lead terminals 3, which comprise metal and will be described below, need to be insulated from the container 10. In a case where the container 10 comprises metal, the lead terminals 3 can be insulated from the container 10 by employing a dielectric material at least at portions of the sidewall 2 through which the lead terminals 3 are made to extend. Particularly preferably, the sidewall 2 comprises ceramic. Since ceramic has good heat resistance, the lead terminals 3 and the container 10 can be bonded to each other with a brazing alloy having a high melting point, such as a silver-copper (Ag—Cu) brazing alloy, with high reliability in airtightness.

Preferably, the sidewall 2 comprises a dielectric material, and the bottom plate 1 comprises metal having a high heat conductivity. Thus, the lead terminals 3 and the container 10 can be easily insulated from each other. Moreover, heat generated from the electronic component 4 when the electronic component 4 operates can be dissipated through the bottom plate 1. In addition, the container 10 having excellent mass-productivity can be obtained.

In the embodiment, the bottom plate 1 has a larger plan-view area than the sidewall 2, that is, the bottom plate 1 extends beyond the outer periphery of the sidewall 2. The bottom plate 1 having such a shape has a screw-accepting portion 1d, which is a through hole, in a part of the bottom plate 1 projecting from the outer periphery of the sidewall 2. With a screw being screwed through the screw-accepting portion 1d, the bottom plate 1 can be efficiently and firmly secured to an external device such as an external electrical circuit board. By firmly securing the bottom plate 1 to the external device, heat generated from the electronic component 4 on the mount 1a of the bottom plate 1 can be efficiently dissipated to the external electrical circuit board or the like, whereby malfunction or the like of the electronic component 4 due to a rise in the temperature of the electronic component 4 can be suppressed.

The projecting part of the bottom plate 1 is provided on a side different from a side where the lead terminals 3 are secured, specifically, on the side opposite the side of the container 10 where the lead terminals 3 are secured, so that screwing is not restricted.

An exemplary method of manufacturing the container 10 including the bottom plate 1 comprising metal and the sidewall 2 comprising a dielectric material will now be described.

The bottom plate 1 is formed from a metal ingot and is subjected to a metalworking process, such as rolling, pressing, or cutting, thereby being formed into a predetermined shape.

The sidewall 2 comprises, for example, $Al_2O_3$ ceramic is manufactured as follows: An appropriate kind of organic binder, organic solvent, plasticizer, dispersant, or the like is added to and mixed with base powder of $Al_2O_3$, silicon oxide ($SiO_2$), magnesium oxide (MgO), calcium oxide (CaO), or the like, whereby slurry is obtained. The slurry is processed by a known doctor blade method, whereby a plurality of ceramic green sheets are obtained. The ceramic green sheets are subjected to an appropriate stamping process so that the sidewall 2 having a predetermined shape is obtained. The stamping process is performed on parts of the ceramic green sheets where, for example, the inner surface of the sidewall 2 and the through holes of the sidewall 2 allowing the lead terminals 3 to pass therethrough are to be provided, while some parts thereof that are to become supports 6, which support the lead terminals 3, are left unprocessed. These ceramic green sheets are stacked in predetermined order and is subsequently fired at a temperature of about 1600° C. Thus, the sidewall 2 is obtained.

Paste layers that are to become metal layers for bonding the lead terminals 3 onto the container 10 may be formed by applying, in a predetermined pattern by screen printing or the like, a paste resulting from mixing an appropriate kind of binder or solvent with metal powder of W, Mo, Mn, or the like to the stack of the ceramic green sheets at predetermined positions where the lead terminals 3 are to be in contact. In addition, a metal layer (metallized layer) for brazing may be provided over a region of a surface of the stack of the ceramic green sheets where the bottom plate 1 is to be bonded. According to need, a nickel (Ni) layer or a gold (Au) layer is plated over the metal layer.

The sidewall 2 is bonded onto the top surface of the bottom plate 1 with a brazing alloy such as a Ag—Cu brazing alloy, whereby the container 10 is obtained. In this case, the top surface of the bottom plate 1 and the bottom surface of the sidewall 2 are bonded to each other with a preform-state brazing alloy, such as a Ag—Cu brazing alloy, provided on the top surface of the bottom plate 1.

To manufacture the container 10 comprising metal or ceramic and provided as an integral body, the entirety of the container 10 is integrally formed by performing the above metalworking process or ceramic-green-sheet stacking.

(Variations of Supports)

While the above description of the supports 6 concerns the case where the sidewall 2 and the supports 6 are formed as an integral body by stamping, the present invention is not limited thereto. The supports 6 may alternatively be separately provided on the container 10. In that case, it is easier to adjust the height level of the electrodes on the top surface of the electronic component 4 and the height levels of the top surfaces of the lead terminals 3, which will be described below. Therefore, operability in connecting the connection lines 5, such as bonding wires, can be improved.

A case where the supports 6 are separately provided on the container 10 will now be described.

As shown in FIG. 1, the tip parts 3a of the lead terminals 3 are secured by the supports 6 that support the tip parts 3a from the bottom surfaces thereof. Thus, while bonding wires are being welded onto the lead terminals 3 in the process of connecting the top surfaces of the tip parts 3a of the lead terminals 3 and the electrodes of the electronic component 4 to each other with the connection lines 5, i.e., the bonding wires, the vertical and horizontal movements of the lead terminals 3 are restricted. Accordingly, the connection lines 5 can be connected easily. Particularly, in a case where the bonding wires have large diameters, a significant external force acts on the lead terminals 3 when the connection lines 5 are connected. However, since the lead terminals 3 are supported by the supports 6 whose height levels have been adjusted, such a connecting process can be performed easily.

The lead terminals 3 may be each supported by the corresponding support 6 not only at the bottom surface thereof but at the bottom and side surfaces thereof by being embedded into the support 6 with the top surface thereof exposed.

The supports 6 can comprise a dielectric material such as $Al_2O_3$ ceramic; AlN ceramic; $3Al_2O_3.2SiO_2$ ceramic; $ZrO_2$ ceramic; $Si_3N_4$ ceramic; SiC ceramic; resin; or glass, or metal such as Cu—W; Cu—Mo; an Fe—Ni—Co alloy; Cu; or SUS.

The lead terminals 3 comprise metal need to be insulated from other conductive bodies included in the container 10. The lead terminals 3 can be easily insulated from other conductive portions of the container 10 by forming the supports 6 from a dielectric material.

If the container 10 comprises a dielectric material, reduction in the insulating characteristic of the lead terminals 3 can be suppressed even if the supports 6 comprise metal. If the container 10 comprises metal, reduction in the insulating characteristic of the lead terminals 3 with respect to the container 10 can be suppressed by, for example, providing an insulating material, such as glass, between the lead terminals 3 and the supports 6.

(Lead Terminals)

The lead terminals 3 comprise metal such as Cu, Ag, an Fe—Ni—Co alloy, an Fe—Ni alloy, Fe, or SUS. From the viewpoint of electrical conductivity, the lead terminals 3 preferably comprise Cu or Ag.

The lead terminals 3 are formed from an ingot of the foregoing metal and are subjected to a processing such as drawing or rolling, whereby a pillar-like or plate-like body is obtained. The resulting body is further subjected to a metal-working process such as pressing or etching, thereby being formed into a predetermined shape such as a rectangular rod-like shape. Alternatively, metal wire is cut into pieces of predetermined lengths, and the cut pieces of wire are press-formed into a predetermined shape.

Each lead terminal 3 formed in such a manner is made to extend through the container 10 from the outside to the inside thereof, and the tip part 3a thereof placed inside the container 10 is attached along one side of the mount 1a. In this case, the connection lines 5, such as bonding wires, connecting the lead terminals 3 and the electrodes of the electronic component 4 can be made shorter than in the conventional case. Consequently, the resistance loss caused by the connection lines 5, such as bonding wires, can be reduced. Moreover, the lengths of the connection lines 5 connecting the electrodes of the electronic component 4 and the lead terminals 3 extending along both sides of the mount 1a can be made uniform, whereby the resistances of the connection lines 5 can also be made uniform. Thus, even if a substantial current-carrying capacity is required, the number of the connection lines or the diameter of the connection lines 5 can be reduced, and the connecting work can be made easier.

In the case where the electronic component 4 has a plurality of electrodes, a plurality of the lead terminals 3 are prepared and are attached on both sides of the mount 1a. Thus, an increased number of terminals of the electronic component 4 can be accommodated.

The lead terminals 3 may alternatively be made to extend through the bottom plate 1 and be attached to the bottom plate 1. However, in the case where the lead terminals 3 are made to extend through the sidewall 2 and are attached to the bottom plate 1, the bottom surface of the bottom plate 1 can be made flat without having parts for accepting the lead terminals 3 to become barriers. Therefore, when the bottom surface of the bottom plate 1 is brought into contact with the external electrical circuit board, heat can be easily dissipated from the bottom plate 1 to the external electrical circuit board.

Each of the lead terminals 3 is attached as follows, for example: The lead terminal 3 is made to extend through the through hole of the container 10. Subsequently, the lead terminal 3 and the through hole, and the bottom surface of the tip part 3a of the lead terminal 3 and the top surface of the support 6 are bonded to each other with, for example, a brazing alloy such as a Ag—Cu brazing alloy, glass, or a bonding material such as resin adhesive.

Here, it is preferable that the top surface of the support 6 and the bottom surface of the tip part 3a of the lead terminal 3 have a bonded region where the top surface of the support 6 and the bottom surface of the tip part 3a of the lead terminal 3 are bonded to each other and a non-bonded region where the support 6 and the lead terminal 3 are not bonded to each other. Thus, the length of the bonded region between the support 6 and the lead terminal 3 can be prevented from becoming large, whereby the stress produced by the difference between the thermal expansion coefficients of the support 6 and the lead terminal 3 can be reduced. Consequently, the occurrence of damage, such as cracks, to the container 10 can be suppressed, and the reliability in airtightness of the interior of the package can be improved.

Figure 3:
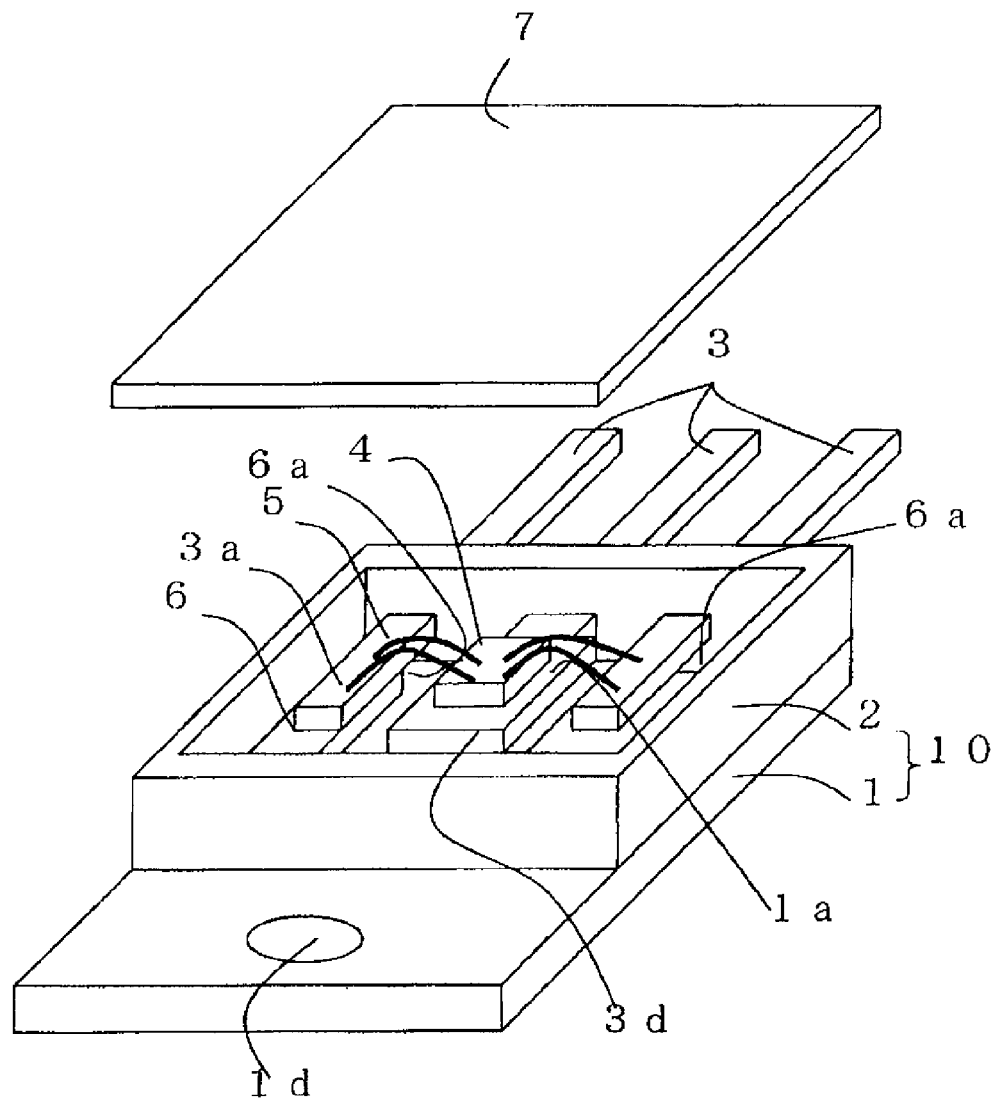
FIG. 3 is a perspective assembly view of an electronic-component-housing package and an electronic device including the same according to a second variation of the present invention.

As shown in FIG. 3, in the non-bonded region where the support 6 and the lead terminal 3 are not bonded to each other, a gap 6a is preferably provided which is defined by the inner surface of the sidewall 2 and the bottom surface of the tip part 3a of the lead terminal 3. Hence, even in a case where the tip part 3a of the lead terminal 3 is long, the gap 6a restricts the connection of the tip part 3a of the lead terminal 3 and the mount 1a, whereby the length of the bonded region is prevented from becoming large. Thus, the stress acting on the mount 1a because of the difference between the thermal expansion coefficients of the mount 1a and the tip part 3a of the lead terminal 3 can be reduced. Consequently, the occurrence of damage, such as cracks, to the container 10 can be suppressed, and the reliability in airtightness of the interior of the package can be improved.

Particularly, even in a case where the support 6 that supports and secures the tip part 3a of the lead terminal 3 comprises ceramic, with the gap 6a defined by the inner surface of the sidewall 2 and the bottom surface of the tip part 3a of the lead terminal 3, i.e., with the gap 6a in the container 10 on the inside of the sidewall 2 and immediately below a portion of the lead terminal 3 penetrating the sidewall 2, the stress acting on the support 6 because of the difference between the thermal expansion coefficients of the support 6 and the lead terminal 3 can be reduced. Accordingly, the occurrence of damage, such as cracks, to the support 6 can be suppressed. Consequently, a ceramic material, which has a higher heat resistance than resin or the like, can be effectively utilized as the support 6.

(Variations of Lead Terminals)

As shown in FIG. 3, each of the lead terminals 3 preferably extends over the mount 1a. Thus, the electronic component 4 can be directly connected to the lead terminal 3, and a high-current electrical signal is efficiently input to and output from the electronic component 4 without being disturbed by resistance loss or the like. That is, in FIG. 3, among the three lead terminals 3, the lead terminal 3 in the center also serves as a mounting substrate 3d forming the mount 1a, and an electrode provided on the bottom surface of the electronic component 4 is electrically connected to the mounting substrate 3d.

Furthermore, as shown in FIG. 1, the top surfaces of the lead terminals 3 are preferably positioned at higher levels than the mount 1a. Thus, if the electronic component 4 on the mount 1a generates heat, the radiant heat is transferred not only to the mount 1a but also to the lead terminals 3 positioned higher than the mount 1a. Therefore, the heat of the electronic component 4 can be easily dissipated to the outside of the package. In addition, the longitudinal side surface of each lead terminal 3 near the electronic component 4 is preferably exposed. Thus, the radiant heat described above can be further transferred to the lead terminals 3.

Furthermore, the top surfaces of the tip parts 3a of the lead terminals 3 are preferably flat. Thus, when the lead terminals 3 and the electronic component 4 are electrically connected to each other with the connection lines 5, such as bonding wires, the connection lines 5, such as bonding wires, can be easily connected to the flat surfaces. For example, the lead terminals 3 each have a rectangular cross section over the entirety thereof, forming a square pillar. Alternatively, the lead terminals 3 each have a circular cross section, forming a cylinder, whereas only the tip part 3a has a flat surface at the top.

(Curved Portions)

Figure 2:
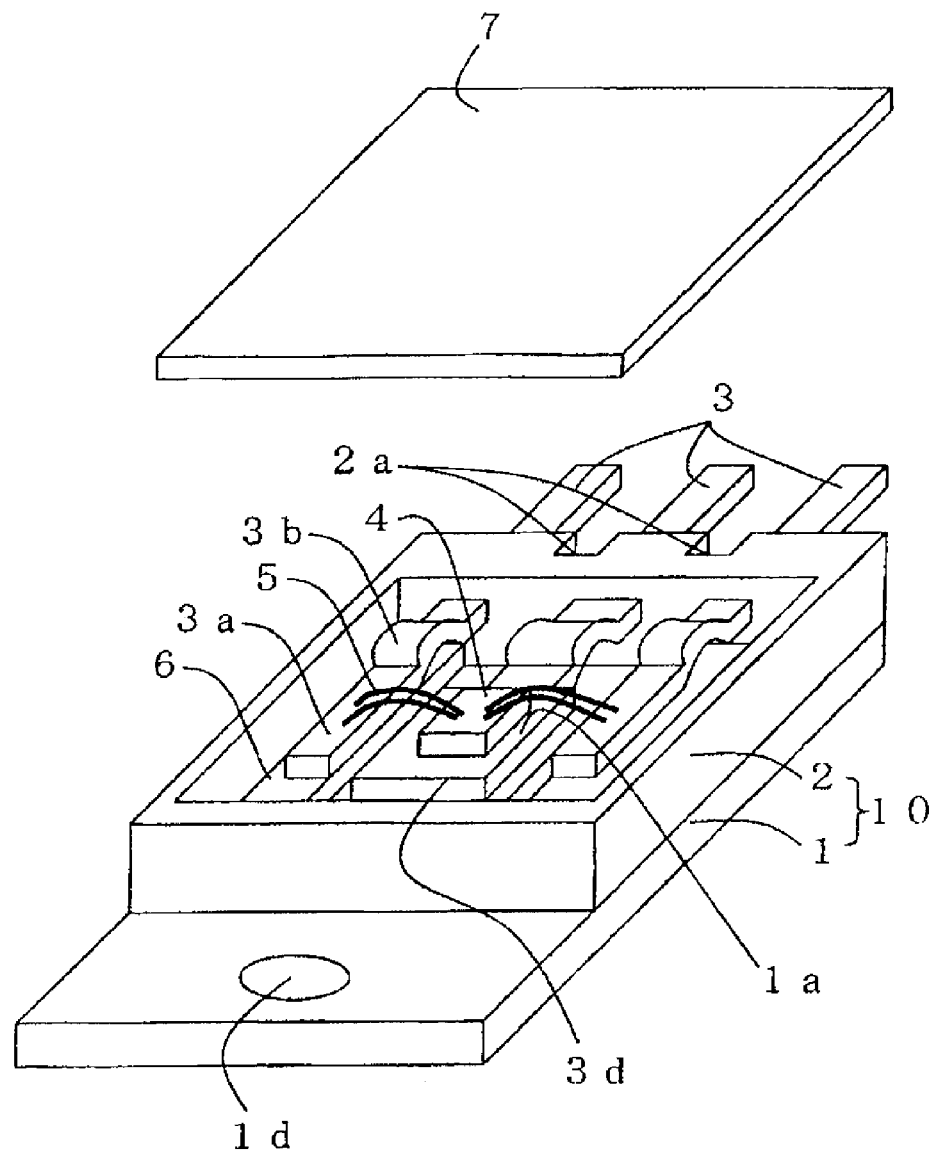
FIG. 2 is a perspective assembly view of an electronic-component-housing package and an electronic device including the same according to a first variation of the present invention.

As shown in FIG. 2, the lead terminals 3 that are made to extend through the container 10 each preferably have a curved portion 3b at a part thereof placed inside the container 10. Thus, even if a part of each lead terminal 3 between the position where the lead terminal 3 is bonded to the sidewall 2 and the position where the lead terminal 3 is bonded to the support 6 expands or contracts because of the effect of thermal expansion, the curved portion 3b allows the lead terminal 3 to easily deform and prevents the lead terminal 3 from bending irregularly. The curved portion 3b can have any of various shapes including a semicircular arc shape, a triangular shape, and a rectangular shape. The curved portion 3b is formed by performing pressing during the process of manufacturing the lead terminal 3.

When the tip part 3a of the lead terminal 3 is bonded to the support 6, described below, the curved portion 3b is preferably provided among the parts of the lead terminal 3 which are supported by the support 6. Thus, the area of the bonded region between the lead terminal 3 and the support 6 is reduced, whereby the stress acting on the support 6 because of the difference between the thermal expansion coefficients of the support 6 and the lead terminal 3 can be reduced. The lead terminal 3 can have one or more curved portions 3b at positions excluding a part of the tip part 3a where the connection lines 5 are to be connected. The curved portion 3b is effective in the case where the tip part 3a is long.

(Flanges)

Figure 4:
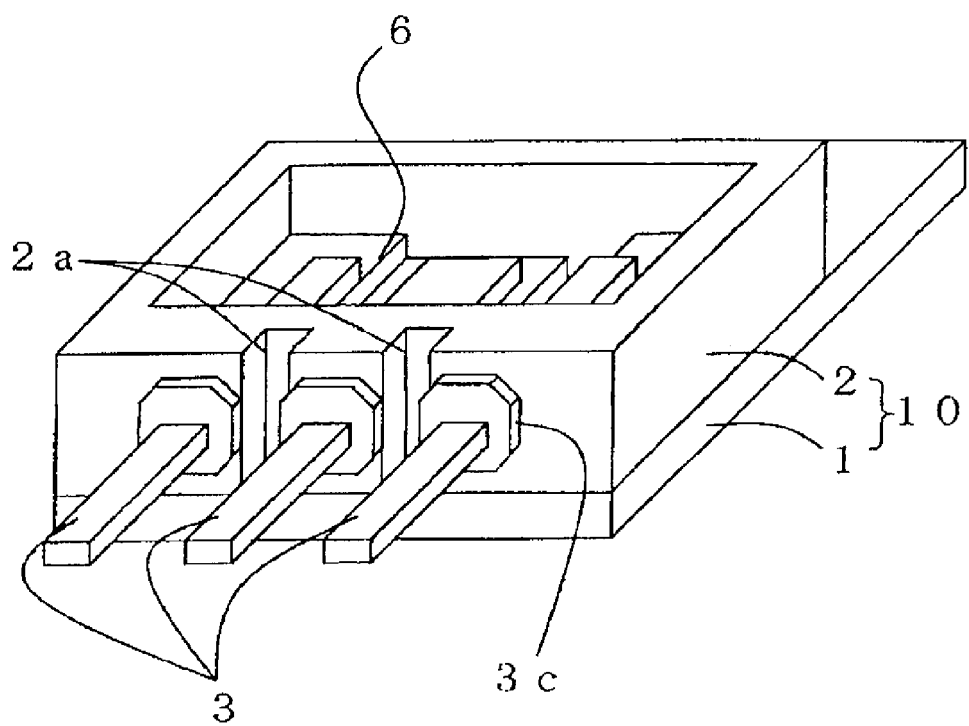
FIG. 4 is a perspective assembly view of an electronic-component-housing package and an electronic device including the same according to a third variation of the present invention.
Figure 5A:
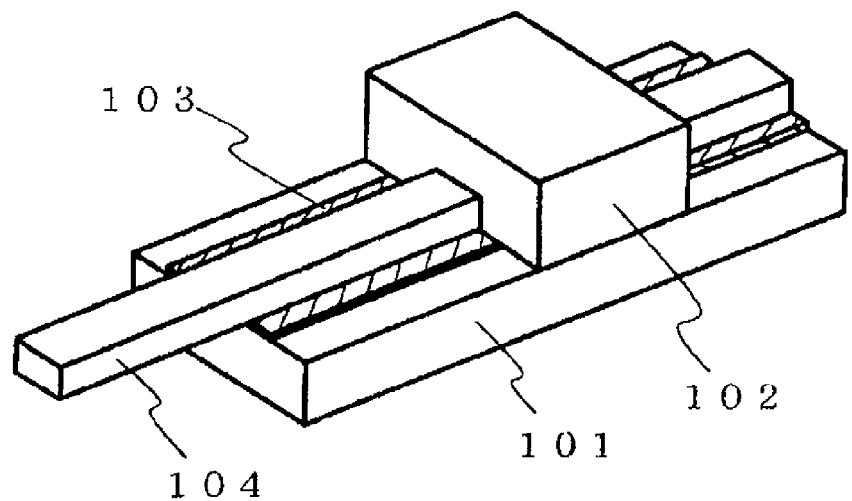
FIG. 5A is a perspective view of an exemplary conventional connection terminal.
Figure 5B:
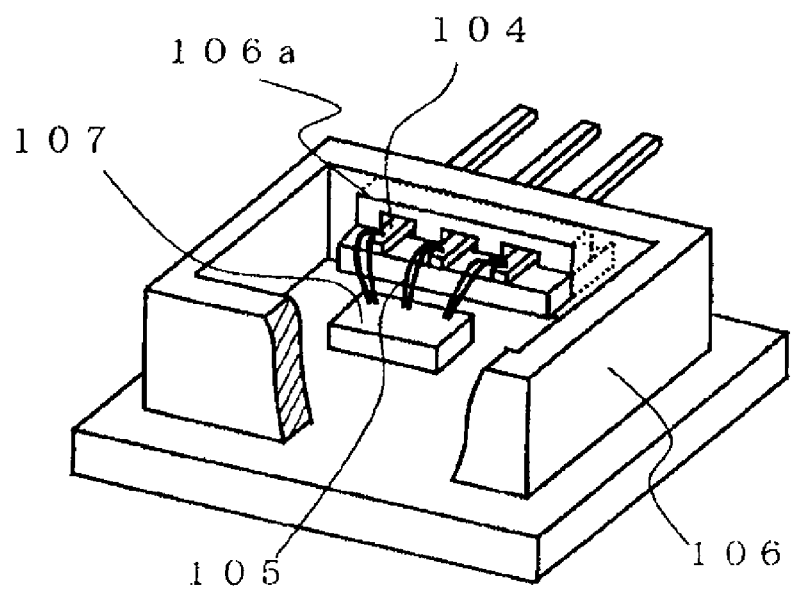
FIG. 5B is a perspective view of an exemplary conventional electronic-component-housing package including the connection terminal shown in FIG. 5A.

Preferably, as shown in FIG. 4, the lead terminals 3 each have a flange 3c at a position where the lead terminal 3 penetrates the sidewall 2 of the container 10, and the lead terminal 3 is bonded at the flange 3c to the outer surface of the container 10 around the through hole. The flange 3c may be formed integrally with the lead terminal 3 by performing press-forming on a metal wire that is to become the lead terminal 3. Alternatively, an annular washer that is to become the flange 3c is brazed onto a predetermined position of a metal wire that is to become the lead terminal 3 with a Ag—Cu brazing alloy or the like. Thus, the reliability in airtightness at the bonded part between the lead terminal 3 and the sidewall 2 can be improved. Furthermore, in the case where the bottom surface of the tip part 3a of the lead terminal 3 is supported and secured by the support 6, if a part of the lead terminal 3 between the flange 3c and the support 6 expands or contracts because of the effect of thermal expansion, the flange 3c deforms to some extent, thereby preventing the irregular bending of the lead terminal 3. The front-view shape of the flange 3c may be any of various shapes, in addition to an octagon as shown in FIG. 4, including polygons such as a square, a circle, an oval, and a diamond.

The flange 3c may be provided on either the inside or the outside of the container 10. Specifically, in a case where the flange 3c is provided on the inside of the container 10, when the electronic component 4 generates heat and the lead terminal 3 expands with the above-described radiant heat, the flange 3c presses the sidewall 2 of the container 10 outward. Consequently, the airtightness of the package is improved. In a case where the flange 3c is provided on the outside of the container 10, when the lead terminal 3 undergoes thermal contraction after being connected to the connection lines 5, the flange 3c presses the sidewall 2 of the container 10 inward. Consequently, the airtightness of the package is improved.

The flange 3c is preferably formed by performing press-forming on the top and side surfaces of a wire. The flange 3c can be provided by forming a constriction on the outer periphery of the wire. Thus, waste of the material of the lead terminal 3 can be reduced, and the lead terminal 3 having the flange 3c can be quickly manufactured.

Preferably, as shown in FIGS. 2 and 4, a plurality of the lead terminals 3 are provided parallel to each other, and a groove 2a is provided between adjacent lead terminals 3 in a surface of the container 10 which the lead terminals 3 penetrates. Thus, in the case where the container 10 comprises dielectric material, the surface of the container 10 having an increased creepage distance suppresses the occurrence of leakage current between the adjacent lead terminals 3 and the occurrence of surface discharge, whereby a predetermined potential difference can be placed across the adjacent lead terminals 3. Particularly, in the case where the lead terminals 3 have the flanges 3c, the distance for insulation between the lead terminals 3 is small. Therefore, provision of the grooves 2a for obtaining a sufficient creepage distance works effectively.

The plan-view shape of the groove 2a may be any of various shapes, in addition to a square as shown in FIGS. 2 and 4, including a semicircle and a trapezoid. The grooves 2a may be provided when the sidewall 2 is manufactured.

(Connection Lines)

The connection lines 5 are each preferably a bonding wire having a diameter of 300 μm to 500 μm so that the lead terminal 3 and the electronic component 4 can be connected to each other with a low resistance. From the viewpoint of electrical conductivity, the connection line 5 preferably comprises, for example, aluminum (Al), gold (Au), or the like. The connection line 5 is not limited to a bonding wire and may be a connection line 5 to which a copper wire is soldered, a ribbon wire having a large cross-sectional area, or the like.

(Electronic Device)
(Electronic Component)

The electronic component 4 is a bulk-power electronic component that operates with a high-current electrical signal. Examples of the electronic component 4 include a diode, a field-effect transistor (FET), a metal-oxide-semiconductor field-effect transistor (MOSFET), an insulated-gate bipolar transistor (IGBT), and a thyristor. The electronic component 4 is mounted on and secured to the mount 1a of the mounting substrate 3d of the lead terminal 3 comprising metal such as an Fe—Ni—Co alloy, an Fe—Ni alloy, Cu, or Cu—W. The electrodes of the electronic component 4 are electrically connected to the lead terminals 3 with the connection lines 5, such as bonding wires. In this case, the electronic component 4 may also have an electrode on the bottom surface thereof, and the mounting substrate 3d and the electrode on the bottom surface of the electronic component 4 may be electrically connected directly to each other with, for example, solder such as gold-tin (Au—Sn) solder or gold-germanium (Au—Ge) solder, or a brazing alloy such as a Ag—Cu brazing alloy.

For example, in a case where the electronic component 4 is a triode such as a MOSFET, if, for example, the lead terminal 3 is made to extend over the mount 1a, the electrode on the bottom surface of the electronic component 4 and the lead terminal 3 can be connected directly to each other.

In the case where a plurality of the lead terminals 3 are provided, a first lead terminal 3 electrically connected to the drain electrode of the triode electronic component 4 preferably has a longitudinal-sectional area larger than a second lead terminal 3. Thus, the resistance loss caused by the first lead terminal 3 connected to the drain electrode, which in general requires a higher current than the source and gate electrodes, can be reduced.

In addition, the electronic component 4 may be mounted on and secured to the mount 1a with a base (not shown) interposed therebetween, instead of being mounted on the mounting substrate 3d of the lead terminal 3, the base comprising a dielectric material such as Al$_2$O$_3$ ceramic, AlN ceramic, or epoxy resin.

Lastly, the lid member 7 is bonded onto the top surface of the sidewall 2 in such a manner as to cover the interior of the container 10, whereby the electronic device according to the embodiment is obtained.

Furthermore, one end of each lead terminal 3 placed on the outside of the package is electrically connected to an external electrical circuit, whereby the external electrical circuit and the electronic component 4 are electrically connected to each other, and the electronic component 4 operates in such a manner as to receive and sends an electrical signal from and to the external electrical circuit.

FIGS. 1 to 4 show exemplary electronic devices in each of which a single electronic component 4 is mounted. In the package according to a variation of the present invention, it is easy to mount two or more electronic components 4 in a direction in which the lead terminals 3 extend. Moreover, by connecting the electrodes of the electronic components 4 to the respective lead terminals 3 extending alongside the electronic components 4 with the connection lines 5, the electronic components 4 can be connected to the lead terminals 3 in parallel with each other with the same number of the connection lines 5 of the same length. Thus, an electronic device capable of accommodating a high current can be obtained easily.

The present invention is not limited to the above embodiment, and various changes can be made thereto without departing from the scope of the present invention.

For example, while the electronic-component-housing packages shown in FIGS. 1 to 4 are each an exemplary case where the lead terminals 3 are provided on one side of the sidewall 2, the lead terminals 3 may be provided on opposite sides or on a plurality of sides such that each of the lead terminals 3 is connected to the electronic component 4 mounted on each of the plurality of sides. The package according to the present invention can also be used for the purpose of reducing the resistance loss caused by the connection lines 5 along with the skin effect occurring in high-frequency applications.

The invention claimed is:

1. A package comprising:
   a container comprising a rectangular mount on which an electronic component is to be mounted and a sidewall surrounding the mount; and
   a lead terminal extending from an inside of a space enclosed by the sidewall to an outside of the space, a tip part of the lead terminal extending and being attached along one side of the mount,
   wherein the container further comprises a support supporting the lead terminal, and
   wherein the support and the terminal have a bonded region where the support and the lead terminal are bonded to each other and a non-bonded region where the support and the lead terminal are not bonded to each other.

2. The package according claim 1, wherein the lead terminal comprises an enlarge portion bonded to the container.

3. The package according to claim 1, wherein a top surface of the lead terminal is positioned at a higher level than the top surface of the mount.

4. The package according to claim 1, wherein a side surface of the lead terminal in the space is exposed.

5. The package according to claim 1, wherein the lead terminal comprises a curved portion placed inside the container.

6. A package comprising:
   a container comprising a rectangular mount on which an electronic component is to be mounted and a sidewall surrounding the mount; and
   a lead terminal extending from an inside of a space enclosed by the sidewall to an outside of the space, a tip part of the lead terminal extending and being attached along one side of the mount,
   wherein the sidewall has a groove in a surface thereof, and the groove is provided between adjacent lead terminals.

7. The package according to claim 1, wherein the lead terminals extend along both sides of the mount.

8. The package according to claim 1, wherein the lead terminal extends over the mount.

9. An electronic device comprising:
   a container comprising a rectangular mount and a sidewall surrounding the mount;
   a lead terminal extending from an inside of a space enclosed by the sidewall to an outside of the space, a tip part of the lead terminal extending along one side of the mount;

an electronic component mounted on the mount and comprising an electrode;

a plurality of connection lines with which the lead terminal and the electrode are electrically connected to each other; and a lid member attached to the sidewall and covering the space, wherein the container further comprises a support supporting the lead terminal, and wherein the support and the terminal have a bonded region where the support and the lead terminal are bonded to each other and a non-bonded region where the support and the lead terminal are not bonded to each other.

10. The electronic device according to claim 9, wherein the electronic component is a metal-oxide-semiconductor field-effect transistor (MOSFET).

11. The electronic device according to claim 10, wherein one of the lead terminals is electrically connected to a drain electrode of the electronic component, and the one of the lead terminals has a larger longitudinal-sectional area than the other lead terminals.

12. An electronic device comprising:

a container comprising a rectangular mount and a sidewall surrounding the mount;

a lead terminal extending from an inside of a space enclosed by the sidewall to an outside of the space, a tip part of the lead terminal extending along one side of the mount;

an electronic component mounted on the mount and comprising an electrode;

a plurality of connection lines with which the lead terminal and the electrode are electrically connected to each other; and a lid member attached to the sidewall and covering the space;

wherein the sidewall has a groove in a surface thereof, and the groove is provided between adjacent lead terminals.

* * * * *